(12) United States Patent
Segawa et al.

(10) Patent No.: US 6,509,791 B2
(45) Date of Patent: Jan. 21, 2003

(54) SWITCHED CAPACITOR FILTER CIRCUIT

(75) Inventors: Yuji Segawa, Kawasaki (JP); Asao Kokubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/050,841

(22) Filed: Jan. 18, 2002

(65) Prior Publication Data

US 2002/0167353 A1 Nov. 14, 2002

(30) Foreign Application Priority Data

May 8, 2001 (JP) .................................... 2001-137109

(51) Int. Cl.[7] .................................................. H03K 5/00
(52) U.S. Cl. ...................................... 327/554; 327/337
(58) Field of Search ............................. 327/552, 554, 327/336, 337, 341; 330/9

(56) References Cited

U.S. PATENT DOCUMENTS 4,446,438 A * 5/1984 Chang et al. ................ 327/554
4,468,798 A * 8/1984 Riebeek ....................... 327/554

FOREIGN PATENT DOCUMENTS

| JP | 55-123226 | 9/1980 |
| JP | 63-196109 | 8/1988 |

* cited by examiner

*Primary Examiner*—Dinh T. Le
(74) *Attorney, Agent, or Firm*—Arent Fox Kintner Plotkin & Kahn PLLC

(57) ABSTRACT

The switched capacitor filter circuit comprises an amplifier whose feedback capacitance Cf is variable. This feedback capacitance is changed based on the control signals received from the outside. Two switches control charging/discharging of a first capacitor. Another Two switches control charging/discharging of a second capacitor. Frequency f1 of a signal for switching the four switches is changed so that a beat frequency varies within a range having no influence with respect to a cutoff frequency while always keeping a value of the f1/Cf constant.

6 Claims, 5 Drawing Sheets

FIG.4

| CONTROL SIGNAL 3 CT3 | CONTROL SIGNAL 1 CT1 | CONTROL SIGNAL 2 CT2 | SWITCH 7 73 | SWITCH 5 71 | SWITCH 6 72 | SWITCHING SIGNAL FREQUENCY F1 | CAPACITANCE CF OF CAPACITANCE VARIABLE UNIT 4 |
|---|---|---|---|---|---|---|---|
| 1 | 0 | 0 | ON | OFF | OFF | 1×f2 | 1×C |
| 0 | 1 | 0 | OFF | ON | OFF | 0.5×f2 | 0.5×C |
| 0 | 0 | 1 | OFF | OFF | ON | 0.25×f2 | 0.25×C |

FIG.5

| CONTROL SIGNAL 3 CT3 | CONTROL SIGNAL 1 CT1 | CONTROL SIGNAL 2 CT2 | SWITCH 7 73 | SWITCH 5 71 | SWITCH 6 72 | SWITCHING SIGNAL FREQUENCY F1 | CAPACITANCE CF OF CAPACITANCE VARIABLE UNIT 4 |
|---|---|---|---|---|---|---|---|
| 1 | 0 | 0 | ON | OFF | OFF | 1×f2 | 1×C |
| 0 | 1 | 0 | OFF | ON | OFF | 0.5×f2 | 0.5×C |
| 0 | 0 | 1 | OFF | OFF | ON | 0.25×f2 | 0.25×C |
| 1 | 1 | 0 | ON | ON | OFF | 1.5×f2 | 1.5×C |
| 1 | 0 | 1 | ON | OFF | ON | 1.25×f2 | 1.25×C |
| 0 | 1 | 1 | OFF | ON | ON | 0.75×f2 | 0.75×C |
| 1 | 1 | 1 | ON | ON | ON | 1.75×f2 | 1.75×C |

FIG.6

| CONTROL SIGNAL 3 CT3 | CONTROL SIGNAL 1 CT1 | CONTROL SIGNAL 2 CT2 | SWITCH 7 73 | SWITCH 5 71 | SWITCH 6 72 | SWITCHING SIGNAL FREQUENCY F1 | CAPACITANCE CF OF CAPACITANCE VARIABLE UNIT 4 |
|---|---|---|---|---|---|---|---|
| 1 | 0 | 0 | ON | OFF | OFF | 1×f2 | 1×C |
| 1 | 1 | 0 | ON | ON | OFF | 2×f2 | 2×C |
| 1 | 1 | 1 | ON | ON | ON | 3×f2 | 3×C |

SWITCHED CAPACITOR FILTER CIRCUIT

FIELD OF THE INVENTION

The present invention relates to a switched capacitor filter circuit, which constitutes an analog filter built in an LSI.

BACKGROUND OF THE INVENTION

An LSI has been designed so as to have multi-function and complex configuration. In order to achieve function centralization and economization, a digital circuit and an analog circuit have been integrated on the same chip. A switched capacitor filter circuit is equivalent to an RC filter circuit comprising a resistor element (device) and a capacitor. However, the switched capacitor filter circuit receives almost no influence by un-uniformity resulting from manufacture process, and has a small area, as compared with the actual RC filter circuit; therefore, the switched capacitor filter circuit has been frequently used as an analog filter integrated into the LSI.

FIG. 1 is a circuit diagram showing a configuration of conventional switched capacitor filter circuit, and FIG. 2 is an equivalent circuit diagram thereof. The conventional switched capacitor filter circuit comprises three capacitors 11, 12 and 13, four switch circuits 14, 15, 16 and 17, and an amplifier 18. One electrode of the first capacitor 11 is connected to an input terminal 21 of the switched capacitor filter circuit via the first switch circuit 14.

The other electrode of the first capacitor 11 is connected to one input terminal of the amplifier 18 via the second switch circuit 15. The other input terminal of the amplifier 18 is grounded. An output terminal of the amplifier 18 is connected to an output terminal 22 of the switched capacitor filter circuit. Both electrodes of the second capacitor 12 are individually connected to the input and output terminals of the amplifier 18 via the third switch circuit 16 and the fourth switch circuit 17. The third capacitor 13 is connected between the input and output terminals of the amplifier 18.

The first to fourth switch circuits 14, 15, 16 and 17 periodically repeat an on/off operation based on a switching frequency f of signal input from a switching signal input terminal 23. By doing so, the charge and discharge of the first and second capacitors 11 and 12 are repeatedly carried out; therefore, the first and second capacitors 11 and 12 and the first to fourth switch circuits 14, 15, 16 and 17 function as equivalent resistor circuits 26 and 27 as shown in FIG. 2. In general, a cutoff frequency characteristic of the switched capacitor filter circuit is determined by a switching frequency f of the switch circuits 14, 15, 16 and 17 and each capacitance of three capacitors 11, 12 and 13.

However, the function centralization of LSI has been made; for this reason, there is the case where a frequency having plural different clocks is used in the circuit, and thereby, data processing must be carried out at plural kinds of transfer speeds. In such an LSI, there is the case where a signal called as beat having a frequency comprising a difference between plural frequencies is generated. For example, a beat frequency fb generated with respect to two frequencies f1 and f2 is expressed by the following equation (1) when m1 and m2 are set as integer.

$$fb = |m1 \times f1 - m2 \times f2| \qquad (1)$$

As is evident from the equation (1), the beat frequency fb variously exists by the combination of m1 and m2. In this case, when a beat having a high signal level is generated in a filter band, this is a factor of deteriorating a filter characteristic. However, a signal level of each beat is different depending upon circuit configuration and layout; for this reason, it is difficult to previously estimate a beat level generable in a filter band, and to make a circuit design. Therefore, conventionally, in the case where characteristic deterioration by beat is generated, the LSI must be again designed; as a result, a problem arises such that the number of design processes increases.

SUMMARY OF THE INVENTION

It is an object of the present invention to provide a switched capacitor filter circuit, which can prevent filter characteristic deterioration by an influence of beat frequency without making a redesign of LSI by changing a beat frequency generated by plural different frequencies from the outside.

According to the present invention, a feedback capacitance of an amplifier is set to be variable, and the feedback capacitance is changed by a control signal from the outside, and further, a switching frequency of switch circuit, for switching the charge and discharge of capacitor is also changed in accordance with a change of the feedback capacitance.

When preventing a deduction of filter characteristic by the influence of beat frequency, the feedback capacitance of amplifier changes by the control signal from the outside, and the switching frequency of switch circuit for switching the charge and discharge of capacitor changes in accordance with a change of the feedback capacitance.

Other objects and features of this invention will become apparent from the following description with reference to the accompanying drawings.

BRIEF DESCRIPTION OF THE DRAWINGS

FIG. 4 is a table to explain an operation of the switched capacitor filter circuit having the configuration shown in FIG. 3;

FIG. 5 is a table to explain another operation of the switched capacitor filter circuit of the present invention; and FIG. 6 is a table to explain still another operation of the switched capacitor filter circuit of the present invention.

DETAILED DESCRIPTION

An embodiment of the present invention will be explained in detail while referring to the accompanying drawings.

Figure 1:
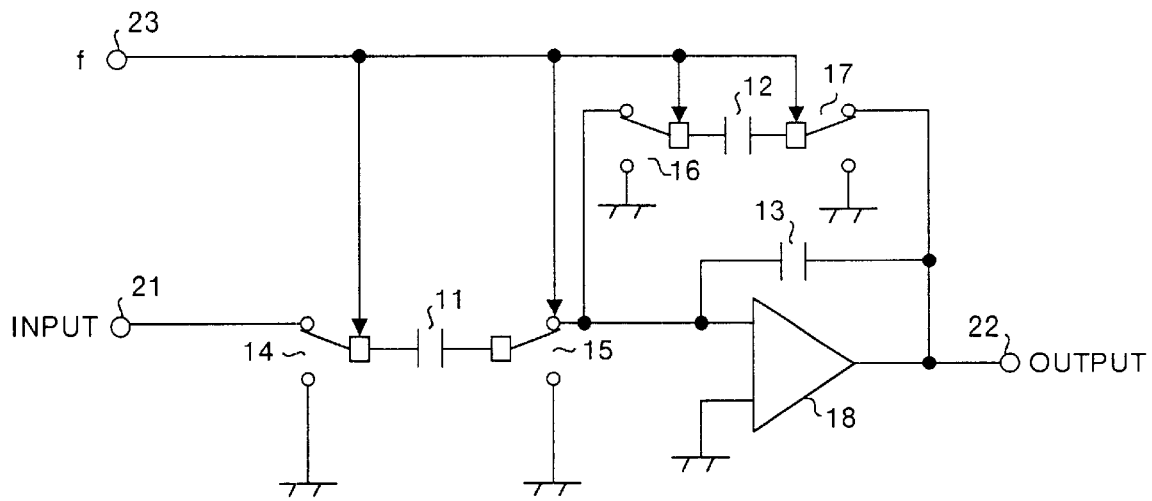
FIG. 1 is a circuit diagram showing a configuration of conventional switched capacitor filter circuit.
Figure 2:
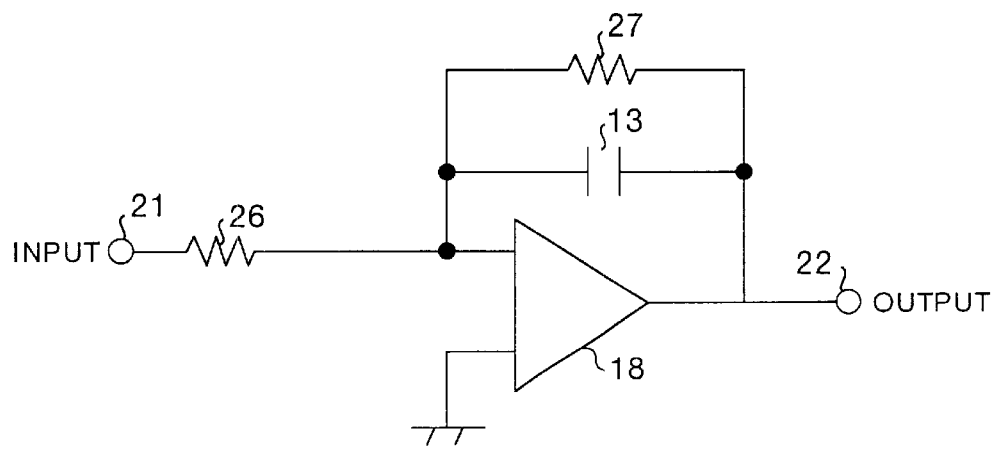
FIG. 2 is an equivalent circuit diagram of the conventional switched capacitor filter circuit.
Figure 3:
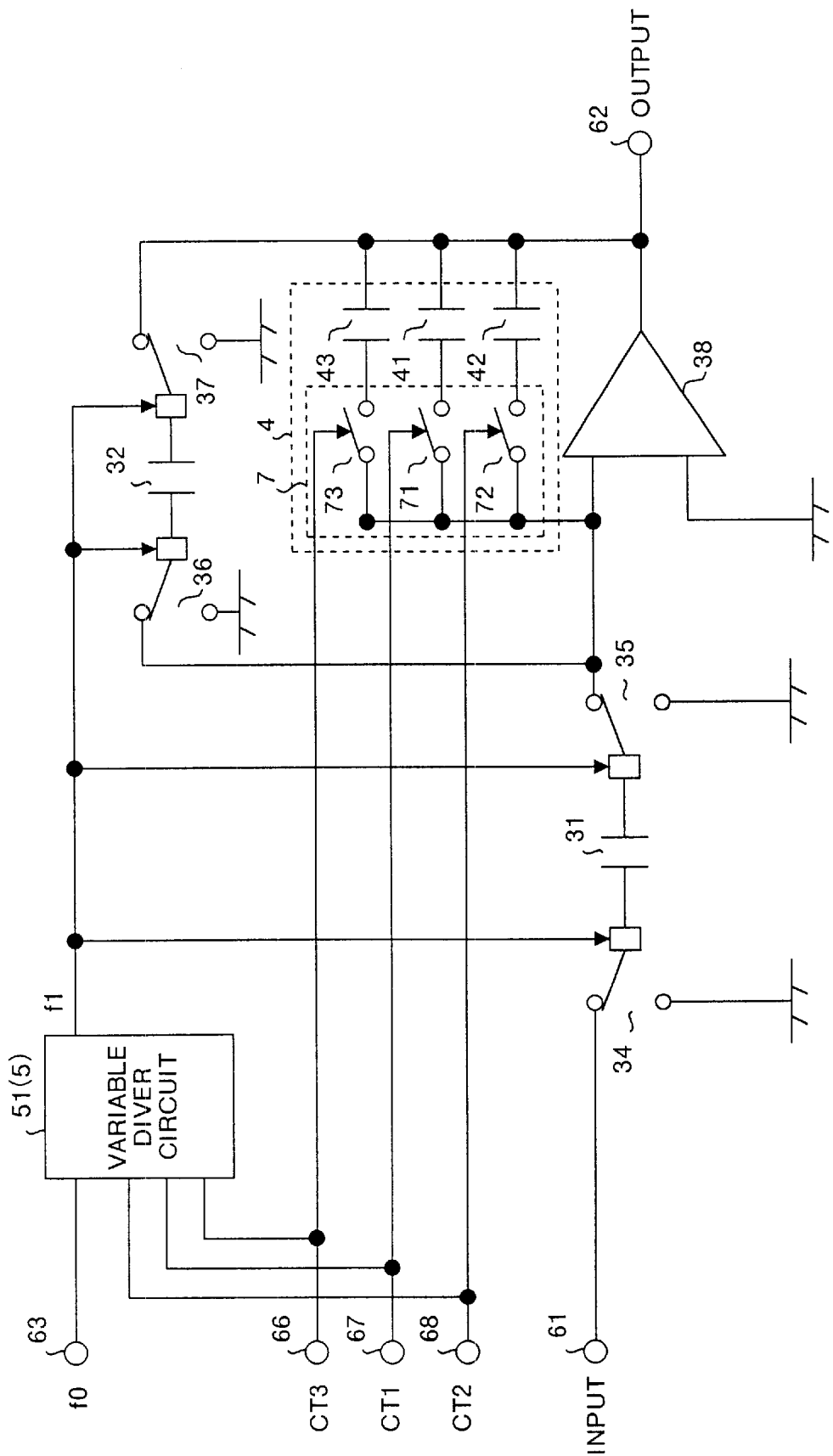
FIG. 3 is a circuit diagram showing a configuration of switched capacitor filter circuit according to one embodiment of the present invention.

FIG. 3 is a circuit diagram showing a configuration of switched capacitor filter circuit according to one embodiment of the present invention. This switched capacitor filter circuit comprises two capacitors 31 and 32, four switch circuits 34, 35, 36 and 37, an amplifier 38, an input terminal 61, an output terminal 62, a clock input terminal 63, and three control terminals 66, 67 and 68 (in particular, the number of terminals is not limited).

Further, the switched capacitor filter circuit comprises capacitance changing unit 4 and frequency changing unit 5. The capacitance changing unit 4 comprises the same number of capacitors as the control terminals 66, 67 and 68, that is, three capacitors 41, 42 and 43, and a selector circuit 7. The selector circuit 7 has the same number of switch circuits as the capacitors 41, 42 and 43 of the capacitance changing unit 4 control terminals 66, 67 and 68, that is, three switch circuits 71, 72 and 73. On the other hand, the frequency changing unit 5 comprises a variable divider circuit 51, for example.

One electrode of the first capacitor 31 is connected to the input terminal 61 of the switched capacitor filter circuit via the first switch circuit 34. The other electrode of the first capacitor 31 is connected to one input terminal of the amplifier 38 via the second switch circuit 35. The other input terminal of the amplifier 38 is grounded. An output terminal of the amplifier 38 is connected to the output terminal of the of the switched capacitor filter circuit. One electrode of the second capacitor 32 is connected to the input terminal of the amplifier 38 via the third switch circuit 36. The other electrode of the second capacitor 32 is connected to the output terminal of the amplifier 38 via the fourth switch circuit 37.

The switch circuits 34, 35, 36 and 37 periodically repeat an on/off operation based on a frequency f1 of switching signal supplied from the variable divider circuit 51 and repeat a charge and discharge. Therefore, the first and second capacitors 31 and 32 function as an equivalent resistor circuit in the same manner as the conventional case.

In the capacitance changing unit 4, the third capacitor 41 is connected in parallel between the input and output terminals of the amplifier 38 via the fifth switch circuit 71. Further, the fourth capacitor 42 is connected in parallel between the input and output terminals of the amplifier 38 via the sixth switch circuit 72. Further, the fifth capacitor 43 is connected in parallel between the input and output terminals of the amplifier 38 via the seventh switch circuit 73.

Although there is no special limitation, for example, if a capacitance of the fifth capacitor 43 is set as C, the third and fourth capacitors 41 and 42 have a capacitance of 0.5×C and a capacitance of 0.25×C, respectively. In other words, the capacitance of the third capacitor 41 is approximately twice as much as the capacitance of the fourth capacitor 42, and further, the capacitance of the fifth capacitor 43 is approximately four times as much as the capacitance of the fourth capacitor 42.

The fifth switch circuit 71 makes an on/off operation in accordance with an input level of first control signal CT1 input from the outside via the first control terminal 67. Likewise, the sixth switch circuit 72 and the seventh switch circuit 73 make an on/off operation in accordance with each input level of second control signal CT2 and third control signal CT3, respectively. Of the third to fifth capacitors 41, 42 and 43, only capacitor connected to the on-state switch circuit of the firth to seventh switch circuits 71, 72 and 73 is active (effective) as a feedback capacitance of the amplifier 38.

The variable divider circuit 51 divides a clock of frequency f0 supplied from the outside via the clock input terminal 63 into a frequency f1 response to the input level of the first to third control signals CT1, CT2 and CT3, and thereafter, supplies the frequency as a switching signal to the first to fourth switch circuits 34, 35, 36 and 37. In this case, the switching signal frequency f1 is a value corresponding to a capacitance of capacitor effective to the circuit in the capacitance changing unit 4.

For example, the following is a description on the case where the switching signal frequency f1 is set as f2 when only fifth capacitor 43 having the capacitance C is effective. When only third capacitor 41 having the capacitance 0.5×C is effective, the switching signal frequency f1 is ½ of f1, that is, 0.5×f2. Further, when only fourth capacitor 42 having the capacitance 0.25×C is effective, the switching signal frequency f1 is ¼ of f1, that is, 0.25×f2.

FIG. 4 is a table showing a relation between each input level of the first to third control signals CT1, CT2 and CT3, on/off state of the fifth to seventh switch circuits 71, 72 and 73 of the capacitance changing unit 4, switching signal frequency f1 and a capacitance Cf of the capacitance changing unit 4. Although no special limitation is made, in FIG. 4, of the input levels of the first to third control signals CT1, CT2 and CT3, any one of these levels becomes "1", and the remaining two levels become "0". In other words, of the fifth to seventh switch circuits 71, 72 and 73, any one of these circuits becomes an on state, and the remaining two circuits become an off state.

For example, in the switched capacitor filter circuit of this embodiment, in the case where only third control signal CT3 is "1", only seventh switch circuit 73 becomes an on state. As a result, the switching signal frequency f1 is 1×f2, and further, the capacitance Cf of the capacitance changing unit 4 is 1×C.

Further, in the case where only first control signal CT1 is "1", only fifth switch circuit 71 becomes anon state, and as a result, the switching signal frequency f1 is 0.5×f2, and further, the capacitance Cf of the capacitance changing unit 4 is 0.5×C. Furthermore, in the case where only second control signal CT2 is "1", only sixth switch circuit 72 becomes anon state, and as a result, the switching signal frequency f1 is 0.25×f2, and further, the capacitance Cf of the capacitance changing unit 4 is 0.25×C.

In this case, when each capacitance of the first and second capacitors 31 and 32 is set as C31 and C32, the circuit characteristic of the switched capacitor filter circuit of this embodiment, that is, a direct current gain is expressed by the following equation (2).

$$\text{Direct current gain}=C31/C32 \tag{2}$$

Therefore, the direct current gain is always a constant value. Moreover, a cutoff frequency is expressed by the following equation (3).

$$\text{Cutoff frequency}=C32 \cdot f1/2\pi Cf \tag{3}$$

The capacitance C32 of the second capacitor 32 is constant, and further, as seen from FIG. 4, the value of f1/Cf is f2/C, that is, constant, even if the switching signal frequency f1 and the capacitance Cf of the capacitance changing unit 4 change. Therefore, in this embodiment, the cutoff frequency always becomes a constant value.

On the contrary, the beat frequency fb receives an influence by the switching signal frequency f1. Therefore, in the switched capacitor filter circuit of this embodiment, the switching signal frequency f1 is changed into f2, 0.5×f2 or 0.25×f2, and thereby, the beat frequency fb changes. More specifically, in this embodiment, it is possible to change the beat frequency fb while the direct current gain and the cutoff frequency of the switched capacitor filter circuit being kept constant.

According to the above-explained embodiment, the first to third control signals CT1, CT2 and CT3 is properly input from the outside, and thereby, the capacitance Cf of the capacitance changing unit 4 changes while the switching signal frequency f1 output from the variable divider circuit 51 changes in accordance with a change of the capacitance Cf. By doing so, it is possible to change the beat frequency fb without changing the direct current gain and the cutoff frequency. Therefore, in the case where a beat signal is generated, the beat frequency is changed to a range having no influence with respect to a cutoff frequency, and thereby, it is possible to prevent filter characteristic deterioration by the influence of beat frequency without making a redesign of LSI.

Moreover, the capacitance changing unit 4 is composed of three capacitors 41, 42 and 43 and three switch circuits 71, 72 and 73. The present invention is not limited to the embodiment, and the capacitance changing unit 4 may be composed of two or four capacitors and switch circuits or more. Further, the number of control terminals inputting a control signal for switching each on/off operation of switch circuits 71, 72 and 73 may be two or four or more.

Furthermore, the frequency changing unit 5 comprises the variable divider circuit 51 for dividing an external clock. The present invention is not limited to the embodiment, and the frequency changing unit 5 may comprise a circuit for multiplying a frequency.

Moreover, any one of three capacitors 41, 42 and 43 of the capacitance changing unit 4 is connected so as to be effective with respect to the circuit. The present invention is not limited to the embodiment, and two capacitors may be simultaneously connected so as to be effective with respect to the circuit. In addition, three capacitors may be all connected so as to be effective with respect to the circuit.

By doing so, the switching signal frequency f1 given an influence to the beat frequency fb is finely changed at equal frequency interval as shown in FIG. 5, that is, 0.25×f2, 0.5×f2, 0.75×f2, 1×f2, 1.25×f2, 1.5×f2 and 1.75×f2. Therefore, it is possible to carrying out further fine adjustment for changing the beat frequency fb into a range having no influence with respect to the cutoff frequency.

Furthermore, the capacitance of three capacitors 41, 42 and 43 of the capacitance changing unit 4 is mutually different. The present invention is not limited to the embodiment, and these capacitors may have the same capacitance C. In this case, as shown in FIG. 6, in accordance with each input level of the control signals CT1, CT2 and CT3, the capacitance Cf of the capacitance changing unit 4 changes as 1×C, 2×C or 3×C. Thus, in response to the change of the capacitance, the switching signal frequency f1 may change as 1×f2, 2×f2 or 3×f2.

According to the present invention, in order to prevent filter characteristic deterioration by the influence of beat frequency, the feedback capacitance of amplifier changes by the control signal from the outside, and the switching frequency of the switch circuit for switching the charge and discharge of capacitor changes in accordance with a change of the feedback capacitance. By doing so, it is possible to change the beat frequency from the outside. Therefore, it is possible to prevent a filter characteristic deterioration by the influence of beat frequency without making a redesign of LSI.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A switched capacitor filter circuit comprising:

a clock input terminal through which a clock is received from outside of said circuit;

a control terminal through which a control signal is received from the outside;

a signal input terminal through which an input signal is received from the outside;

a capacitance changing unit which changes a capacitance based on the control signal;

a frequency changing unit which changes a frequency of the clock based on the control signal in accordance with the changed capacitance, and outputs a switching signal;

an amplifier which is provided the changed capacitance as a feedback capacitor and provides an output signal obtained by amplifying the input signal to a signal output terminal; and an input capacitor which is disposed between the signal input terminal and the amplifier and is periodically charged or discharged based on the switching signal.

2. The switched capacitor filter circuit according to claim 1, wherein the capacitance changing unit comprises a plurality of capacitors; and a selector circuit which connects at least one said capacitor to the amplifier, and disconnects the remaining said capacitors from the amplifier.

3. The switched filter circuit according to claim 1, wherein the capacitance changing unit comprises three capacitors; and a selector circuit which connects one said capacitor to the amplifier, and disconnects the remaining two said capacitors from the amplifier.

4. The switched capacitor filter circuit according to claim 3, wherein a capacitance of a first capacitor of three capacitors of the capacitance changing unit is approximately twice as much as a capacitance of a second capacitor, and a capacitance of a third capacitor is approximately four times as much as a capacitance of a second capacitor.

5. The switched capacitor filter circuit according to claim 4, wherein the frequency changing unit comprises a divider circuit for dividing the clock into two or four.

6. The switched capacitor filter circuit according to claim 1, further comprising:

a fixed capacitor which is disposed between an input and an output of the amplifier, and is periodically charged or discharged based on the switching signal.

* * * * *